United States Patent
Yamaguchi et al.

(10) Patent No.: US 10,312,385 B2
(45) Date of Patent: Jun. 4, 2019

(54) SOLAR CELL SUBSTRATE MADE OF STAINLESS STEEL FOIL AND METHOD FOR MANUFACTURING THE SAME

(75) Inventors: Yasuhiro Yamaguchi, Tokyo (JP); Atsutaka Honda, Tokyo (JP); Naoki Nishiyama, Tokyo (JP); Tokio Nakada, Fuchu (JP)

(73) Assignee: JFE Steel Corporation, Tokyo (JP)

( * ) Notice: Subject to any disclaimer, the term of this patent is extended or adjusted under 35 U.S.C. 154(b) by 208 days.

(21) Appl. No.: 14/402,155

(22) PCT Filed: May 23, 2012

(86) PCT No.: PCT/JP2012/063822
§ 371 (c)(1),
(2), (4) Date: Apr. 6, 2015

(87) PCT Pub. No.: WO2013/175643
PCT Pub. Date: Nov. 28, 2013

(65) Prior Publication Data
US 2015/0206996 A1 Jul. 23, 2015

(51) Int. Cl.
C21D 1/30 (2006.01)
C21D 1/76 (2006.01)
(Continued)

(52) U.S. Cl.
CPC ........ H01L 31/022441 (2013.01); C21D 1/30 (2013.01); C21D 1/76 (2013.01);
(Continued)

(58) Field of Classification Search
CPC ............. H01L 31/0322; H01L 31/0352; H01L 31/022441; H01L 31/03923; H01L 31/18;
(Continued)

(56) References Cited

U.S. PATENT DOCUMENTS 3,684,589 A * 8/1972 Ratz .................. C22C 38/18
148/610
5,986,205 A * 11/1999 Matsune .................. B21B 1/227
136/243
(Continued)

FOREIGN PATENT DOCUMENTS

EP 2650059 10/2013
JP 6222490 1/1987
(Continued)

OTHER PUBLICATIONS

Kessler et al., "Technological aspects of flexible CIGS solar cells and modules," Solar Energy, 77 (2004) pp. 685-695.*
(Continued)

*Primary Examiner* — Keith Walker
*Assistant Examiner* — John A Hevey
(74) *Attorney, Agent, or Firm* — RatnerPrestia

(57) ABSTRACT

Provided are a solar cell substrate made of stainless steel foil which contains 7% to 40% by mass Cr and has a coefficient of linear expansion of $12.0 \times 10^{-6}/°$ C. or less at 0° C. to 100° C. and a thickness of 20 μm to 200 μm is subjected to the preparatory heat treatment for stress relief in an atmosphere consisting of one or more selected from an $N_2$ gas, an $H_2$ gas, an Ar gas, an AX gas, and an HN gas within the range of 250° C. to 1,050° C.; a back-contact made of a Mo layer is formed on a surface of the stainless steel foil subjected to the preparatory heat treatment or an insulating coating is formed on a surface of the stainless steel foil followed by forming the back-contact including the Mo layer thereon; and an absorber layer made of $Cu(In_{1-x}Ga_x)Se_2$ is formed on the back-contact by performing coating formation heat treatment.

16 Claims, 1 Drawing Sheet

(51) Int. Cl.

| | | |
|---|---|---|
| C22C 38/00 | (2006.01) | |
| C22C 38/18 | (2006.01) | |
| C22C 38/26 | (2006.01) | |
| C23C 16/30 | (2006.01) | |
| C23C 16/56 | (2006.01) | |
| H01L 31/18 | (2006.01) | |
| H01L 31/032 | (2006.01) | |
| H01L 31/0224 | (2006.01) | |
| H01L 31/0352 | (2006.01) | |
| H01L 31/0392 | (2006.01) | |
| C22C 38/02 | (2006.01) | |
| C22C 38/04 | (2006.01) | |
| C22C 38/20 | (2006.01) | |
| C22C 38/22 | (2006.01) | |

(52) U.S. Cl.
CPC ............ *C22C 38/004* (2013.01); *C22C 38/02* (2013.01); *C22C 38/04* (2013.01); *C22C 38/18* (2013.01); *C22C 38/20* (2013.01); *C22C 38/22* (2013.01); *C22C 38/26* (2013.01); *C23C 16/305* (2013.01); *C23C 16/56* (2013.01); *H01L 31/0322* (2013.01); *H01L 31/0352* (2013.01); *H01L 31/03928* (2013.01); *H01L 31/18* (2013.01); *H01L 31/1864* (2013.01); *Y02E 10/541* (2013.01); *Y02P 70/521* (2015.11)

(58) Field of Classification Search
CPC ... H01L 31/1864; C23C 16/56; C23C 16/305; C22C 38/004; C22C 38/02; C22C 38/04; C22C 38/18; C22C 38/20; C22C 38/22; C22C 38/26; C21D 1/30; C21D 1/76; Y02P 70/521; Y02E 10/541
See application file for complete search history.

(56) References Cited

U.S. PATENT DOCUMENTS

| | | | |
|---|---|---|---|
| 9,105,779 B2* | 8/2015 | Deligianni | H01L 31/0749 |
| 2009/0311591 A1* | 12/2009 | Snyder | H01M 2/10 |
| | | | 429/156 |
| 2010/0051105 A1* | 3/2010 | Pinarbasi | H01L 31/0296 |
| | | | 136/262 |
| 2010/0154504 A1* | 6/2010 | Cunha | B21D 19/005 |
| | | | 72/340 |
| 2011/0180141 A1* | 7/2011 | Nishida | H01G 9/2022 |
| | | | 136/256 |
| 2012/0305049 A1 | 12/2012 | Yuya | |
| 2014/0011044 A1* | 1/2014 | Yamaguchi | C21D 6/002 |
| | | | 428/606 |

FOREIGN PATENT DOCUMENTS

| | | |
|---|---|---|
| JP | 05306460 | 11/1993 |
| JP | 06299347 | 10/1994 |
| JP | 2003179238 | 6/2003 |
| JP | 2011171707 | 9/2011 |

OTHER PUBLICATIONS

European Search Report dated Aug. 20, 2015 in European Application No. 12877442.9.
Satoh, T. et al., "Cu (In,Ga)Se2 solar cells on stainless steel substrates covered with insulating layers," Solar Energy Materials and Solar Cells, vol. 75, No. 1-2, pp. 65-71, Jan. 1, 2003.
Korean Office Action dated Feb. 26, 2016 for 10-2014-7031326 with Concise Statement of Relevance.
International Search Report for International Application No. PCT/JP2012/063822 dated Sep. 4, 2012.
U.S. Final Office Action for U.S. Appl. No. 13/992,846, dated Jun. 2, 2017, 11 pages.
Forming of Stainless Steel and Heat-Resistant Alloys, Metals Handbook Desk Edition, ASM International, p. 829, 1998, 1 page.
European Exam Report for European Application No. 12 877442.9, dated Nov. 6, 2018—5 pages.

* cited by examiner

SOLAR CELL SUBSTRATE MADE OF STAINLESS STEEL FOIL AND METHOD FOR MANUFACTURING THE SAME

CROSS REFERENCE TO RELATED APPLICATIONS

This is the U.S. National Phase application of PCT/JP2012/063822, filed May 23, 2012, and the disclosure of this application is incorporated herein by reference in its entirety for all purposes.

FIELD OF THE INVENTION

The present invention relates to a solar cell substrate made of stainless steel foil and an absorber layer formed thereon and a method for manufacturing the same.

BACKGROUND OF THE INVENTION

Glass, which is a relatively inexpensive insulator, is widely used as a material for solar cell substrates. However, glass is brittle. Therefore, it is difficult to continuously manufacture a large number of glass solar cell substrates on which an absorber layer formed.

Therefore, solar cell substrates made of a metal sheet (for example, a stainless steel sheet or the like) which can be mass-manufactured and which is more inexpensive than glass are under development. However, the metal sheet is a conductive material. Therefore, in order to use the metal sheet for a substrate for integrated solar cells, an insulating layer needs to be formed on a surface thereof. Alternatively, solar cells attached to power-collecting-surfaced electrodes are connected to each other like silicon solar cells and can be used as a grid type.

For example, Patent Literatures 1 and 2 disclose an insulating sheet including an alumina coating formed on a smooth surface of a stainless steel sheet. When a back-contact including a Mo layer is formed on the insulating sheet and a coating of $Cu(In_{1-x}Ga_x)Se_2$ is formed thereon as an absorber layer, heat treatment for growing crystals of $Cu(In_{1-x}Ga_x)Se_2$ is performed and the resultant insulating sheet is used as an integrated solar cell substrate, whereby production costs can be reduced as compared to a glass solar cell substrate.

Alternatively, in the case of being used as a grid-type solar cell substrate, when a surface of a stainless steel sheet is smoothed, a back-contact made of a Mo layer is formed thereon, and a coating of $Cu(In_{1-x}Ga_x)Se_2$ is formed thereon as an absorber layer, heat treatment for growing crystals of $Cu(In_{1-x}Ga_x)Se_2$ is performed, whereby a solar cell substrate is formed. Incidentally, $Cu(In_{1-x}Ga_x)Se_2$ refers to a substance which is a mixed crystal of $Cu(In)Se_2$ and $Cu(Ga)Se_2$ and which is referred to as CIGS.

In these solar cell substrates using the stainless steel sheets (that is, solar cell substrates made of stainless steel sheet), when insulating layer or the back-contacts are formed, there is a case where Cr layers or the like referred to as barrier layers are formed as underlayers in advance. In this case, the insulating coatings, the back-contacts, and the absorber layers other than the barrier layers are formed in substantially the same way as above.

PATENT LITERATURE

[PTL 1] Japanese Unexamined Patent Application Publication No. Hei 6-299347

[PTL 2] Japanese Unexamined Patent Application Publication No. Hei 5-306460

SUMMARY OF THE INVENTION

In order to further reduce production costs of solar cell substrates made of stainless steel sheet, the reduction in thickness of stainless steel sheets used is required. The following technique is under investigation: a technique in which stainless steel foil having an absorber layer formed thereon or insulating foil having an insulating coating and absorber layer formed thereon is used as a solar cell substrate.

In a solar cell substrate (hereinafter referred to as a solar cell substrate made of stainless steel foil) made from stainless steel foil, for a grid type, stainless steel foil is smoothed, a back-contact made of a Mo layer is formed on a surface thereof, and a coating of $Cu(In_{1-x}Ga_x)Se_2$ is formed thereon as an absorber layer. Alternatively, for a integration type, insulating foil is prepared by forming an insulating coating (for example, an alumina coating) on a surface of stainless steel foil, a back-contact is formed on the insulating coating, and a $Cu(In_{1-x}Ga_x)Se$ coating which is an absorber layer is formed thereon.

In both the cases, there is a problem in that the absorber layers, the insulating coatings, and the back-contacts tend to peel off due to the heat treatment performed for the purpose of forming the $Cu(In_{1-x}Ga_x)Se_2$ coatings. If the $Cu(In_{1-x}Ga_x)Se_2$ coatings, which are the absorber layers, peel off, then the conversion efficiency of converting sunlight into electricity is reduced. In addition, if back-contacts or the insulating layer peel off, then the absorber layers formed thereon are also peel off and therefore a reduction in conversion efficiency is caused.

It is an object to provide a solar cell substrate made of stainless steel foil in which the peeling off of a $Cu(In_{1-x}Ga_x)Se_2$ coating that is an absorber layer is prevented and a method for manufacturing the same.

The inventors have investigated what causes the peeling off of an absorber layer, an insulating coating, or a back-contact from a solar cell substrate made of stainless steel foil. As a result, the inventors have found that the deformation of stainless steel foil due to the heat treatment performed for the purpose of forming a $Cu(In_{1-x}Ga_x)Se_2$ coating is a cause.

That is, residual stress is generated in the stainless steel foil by repeating cold rolling in the course of manufacturing the stainless steel foil. After the insulating coating and the back-contact are deposited on the stainless steel foil, treatment (hereinafter referred to as coating formation heat treatment) in which both coating and heating for forming the absorber layer are performed is performed (an integration type) or after the back-contact is deposited on the Stainless steel foil, heat treatment for coating formation for forming the absorber layer is performed (a grid type), whereby the residual stress in the stainless steel foil is relieved, resulting in that the stainless steel foil is deformed and the absorber layer, the back-contact, and/or the insulating coating is cracked and peel off.

Accordingly, by heat-treating the stainless steel foil (hereinafter referred to as the preparatory heat treatment) in order that residual stress is removed therefrom, followed by that an insulating coating and a back-contact are deposited and heat treatment for coating formation for forming the absorber layer is performed in the case of an integration type or the back-contact is deposited on the stainless steel foil and heat treatment for coating formation for forming the absorber layer is performed in the case of a grid type, the deformation of the stainless steel foil due to coating formation heat treatment is reduced and therefore a $Cu(In_{1-x}Ga_x)Se_2$ coating which is the absorber layer can be prevented from peeling off.

The present invention has been made on the basis of such a finding.

That is, the present invention provides a method for manufacturing a solar cell substrate made of stainless steel foil. The method includes subjecting stainless steel foil which contains 7% to 40% by mass Cr and which has a coefficient of linear expansion of $12.0 \times 10^{-6}/°$ C. or less at 0° C. to 100° C. and a thickness of 20 μm to 200 μm and which is subjected to the preparatory heat treatment for stress relief in an atmosphere consisting of one or more selected from an $N_2$ gas, an $H_2$ gas, an Ar gas, an AX gas, and an HN gas within the range of 250° C. to 1,050° C.; forming a back-contact made of a Mo layer on a surface of the stainless steel foil subjected to the preparatory heat treatment, or forming an insulating coating on a surface of the stainless steel foil followed by forming the back-contact made of the Mo layer thereon; and forming an absorber layer made of $Cu(In_{1-x}Ga_x)Se_2$ on the back-contact by performing coating formation heat treatment.

In the method for manufacturing a solar cell substrate made of stainless steel foil according to the present invention, the preparatory heat treatment is preferably performed within the range of 250° C. to 900° C. and more preferably 250° C. to 700° C. The coating formation heat treatment is preferably performed within the range of 450° C. to 700° C.

The present invention provides a solar cell substrate made of stainless steel foil obtained in such a way that stainless steel foil which contains 7% to 40% by mass Cr and which has a coefficient of linear expansion of $12.0 \times 10^{-6}/°$ C. or less at 0° C. to 100° C. and a thickness of 20 μm to 200 μm and which is subjected to preparatory heat treatment for stress relief in an atmosphere which consists of one or more selected from an $N_2$ gas, an $H_2$ gas, an Ar gas, an AX gas, and an HN gas within the range of 250° C. to 1,050° C.; a back-contact made of a Mo layer is formed on a surface of the stainless steel foil subjected to the preparatory heat treatment, or an insulating coating is formed on a surface of the stainless steel foil followed by forming the back-contact made of the Mo layer thereon; and an absorber layer made of $Cu(In_{1-x}Ga_x)Se_2$ is formed on the back-contact by performing coating formation heat treatment. The changes in width and length of the stainless steel foil before and after being subjected to the coating formation heat treatment satisfy the following inequalities (1) and (2):

$$100 \times |(W_1-W_0)|/W_0 \leq 0.037\% \qquad (1)$$

$$100 \times |(L_1-L_0)|/L_0 \leq 0.037\% \qquad (2)$$

where $W_0$ is the width (mm) of the stainless steel foil before being subjected to the coating formation heat treatment, $W_1$ is the width (mm) of the stainless steel foil after being subjected to the coating formation heat treatment, $L_0$ is the length (mm) of the stainless steel foil before being subjected to the coating formation heat treatment, and $L_1$ is the length (mm) of the stainless steel foil after being subjected to coating formation heat treatment.

In the solar cell substrate made of stainless steel foil according to the present invention, the changes in width and length of the stainless steel foil before and after being subjected to the coating formation heat treatment preferably satisfy inequalities (3) and (4) below. The temperature of the thermal pretreatment preferably ranges from 250° C. to 700° C. The temperature of the coating formation heat treatment preferably ranges from 450° C. to 700° C.

$$100 \times |(W_1-W_0)|/W_0 \leq 0.018\% \qquad (3)$$

$$100 \times |(L_1-L_0)|/L_0 \leq 0.018\% \qquad (4)$$

According to the present invention, the peeling off of an absorber layer formed in a solar cell substrate (that is, a solar cell substrate made of stainless steel foil) including stainless steel foil which is inexpensive and which can be mass-manufactured can be prevented. This contributes to the reduction of production costs of solar cells and enables the conversion efficiency of converting sunlight into electricity to be increased.

DETAILED DESCRIPTION OF EMBODIMENTS OF THE INVENTION

Figure 1:
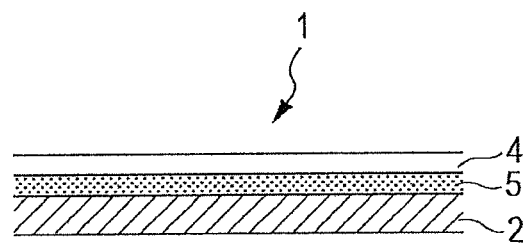
FIG. 1 is a schematic sectional view of an example of a solar cell substrate made of stainless steel foil according to the present invention.
Figure 2:
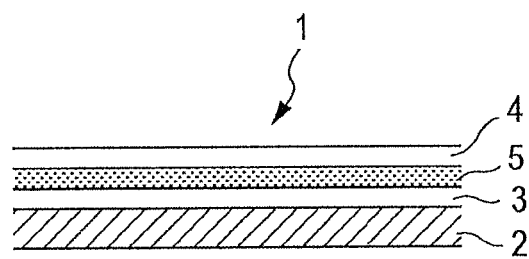
FIG. 2 is a schematic sectional view of another example of a solar cell substrate made of stainless steel foil according to the present invention.

FIGS. 1 and 2 each shows a schematic sectional view of an example of a solar cell substrate made of stainless steel foil according to the present invention. In the present invention, a manufacturing method prior to the foil rolling to produce stainless steel foil 2 which is a material of a solar cell substrate made of stainless steel foil 1 is not particularly limited.

First, components of the stainless steel foil 2 are described.

When the content of Cr is less than 7% by mass, the corrosion resistance during long-term use is insufficient and the durability of the solar cell substrate made of stainless steel foil is deteriorated. However, when the content of Cr is more than 40% by mass, there is a problem in that the toughness of a hot-rolled steel sheet which is a partly-finished product in a step of manufacturing the stainless steel foil is significantly reduced and therefore the hot-rolled steel sheet cannot pass through a production line. Therefore, the content of Cr needs to be 7% to 40% by mass.

The stainless steel foil 2 may contain Nb and/or Mo in the above composition.

In the case where the stainless steel foil 2 contains Nb, when the content of Nb is less than 0.05% by mass, a deformation resistance effect during crystallization heat treatment is reduced. However, when Nb is more than 1.5% by mass, there is a problem in that weldability during the manufacture of the hot-rolled steel sheet, which is the partly-finished product in the step of manufacturing the stainless steel foil, is significantly reduced and therefore the hot-rolled steel sheet cannot pass through the production line. Accordingly, the content of Nb preferably ranges from 0.05% to 1.5% by mass.

In the case where the stainless steel foil 2 contains Mo, when the content of Mo is less than 0.3% by mass, a deformation resistance effect during heat treatment for coating formation is reduced. However, it is more than 3.0% by mass, there is a problem in that hot workability during the manufacture of the hot-rolled steel sheet, which is the partly-finished product in the step of manufacturing the stainless steel foil, is reduced and therefore the hot-rolled steel sheet cannot pass through the production line. Accordingly, the content of Mo preferably ranges from 0.3% to 3.0% by mass, being more preferably 2.0% by mass or less.

Examples of such steel include SUS 430 (17% Cr steel), SUS 447J1 (30% Cr-2% Mo steel), 9% Cr steel, 20% Cr-5% Al steel, and SUS 304 (18% Cr-8% Ni steel).

Added preferable components other than Cr, Nb, and Mo described above are as described below. Incidentally, all percentages defining the composition of steel refer to mass percent.

C: 0.12% or Less

C combines with Cr in steel to cause a reduction in corrosion resistance and therefore is preferably as low as possible. When it is 0.12% or less, the corrosion resistance is not significantly reduced. Therefore, it is preferably 0.12% or less and more preferably 0.04% or less.

Si: 2.5% or Less

Si is an element used for deoxidation. When Si is excessively contained, a reduction in ductility is caused. Therefore, it is preferably 2.5% or less and more preferably 1.0% or less.

Mn: 1.0% or Less

Mn combines with S to form MnS and causes a reduction in corrosion resistance. Therefore, it is preferably 1.0% or less and more preferably 0.8% or less.

S: 0.030% or Less

As described above, S combines with Mn to form MnS and causes a reduction in corrosion resistance. Therefore, it is preferably 0.030% or less and more preferably 0.008% or less.

P: 0.050% or Less

P causes a reduction in ductility and therefore is preferably as low as possible. When it is 0.050% or less, the ductility is not significantly reduced. Therefore, it is preferably 0.050% or less and more preferably 0.040% or less.

Essential components are as described above. In the present invention, elements below may be appropriately contained.

At Least One Selected from Ti and Zr: 1.0% or Less in Total

Both Ti and Zr are elements that fix C and N in steel in the form of a carbide, a nitride, or a carbonitride and are useful in improving corrosion resistance. However, when more than 1.0% of Ti and/or Zr is contained, a reduction in ductility is significant. Therefore, these elements are limited to 1.0% or less in the case of either single addition or combined addition. In order to sufficiently exhibit the effect of adding these elements, 0.02% or more of Ti and/or Zr is preferably contained.

Al: 0.20% or Less

Al is an element used for deoxidation. When Al is excessively contained, a reduction in ductility is caused. Therefore, it is preferably 0.20% or less and more preferably 0.15% or less. However, this does not apply to the case of using 20Cr-5Al steel or the like intentionally containing Al.

N: 0.05% or Less

N combines with Cr in steel to cause a reduction in corrosion resistance and therefore is preferably low. When it is 0.05% or less, the corrosion resistance is not significantly reduced. Therefore, it is preferably 0.05% or less and more preferably 0.015% or less.

In addition, 1.0% or less of each of Ni, Cu, V, and W may be contained for the purpose of improving the corrosion resistance. Furthermore, 0.1% or less of each of Ca, Mg, REMs (rare-earth metals), and B may be contained for the purpose of improving the hot workability.

The remainder are Fe and inevitable impurities. Among the inevitable impurities, O (oxygen) is preferably 0.02% or less.

When the coefficient of linear expansion of the stainless steel foil 2 is more than $12.0 \times 10^{-6}$/° C. at 0° C. to 100° C., an absorber layer peel, off by heat treatment for coating formation. Thus, the coefficient of linear expansion of the stainless steel foil 2 is $12.0 \times 10^{-6}$/° C. or less at 0° C. to 100° C.

Such stainless steel foil can be obtained by foil-rolling stainless steel corresponding to, for example, JIS SUS 430 (so-called 17% Cr steel), SUS 444 (so-called 18Cr-2Mo steel), SUS 447J1 (so-called 30Cr-2Mo steel), or the like.

Next, the thickness of the stainless steel foil 2 is described below.

When the thickness of the stainless steel foil 2 is less than 20 μm, the stainless steel foil 2 is extremely easily to be folded or ripped; hence, a crack extends from a fold or rip in the stainless steel foil 2 into an insulating coating or absorber layer described below and therefore the insulating coating or the absorber layer tend to peal off. However, when it is more than 200 μm, it is higher in cost than glass substrates. Thus, the thickness of the stainless steel foil 2 ranges from 20 μm to 200 μm.

Before the insulating coating 3, a back-contact 5, or the like is formed on the stainless steel foil 2, which has such a composition and thickness, the stainless steel foil 2 is subjected to the preparatory heat treatment, whereby the residual stress caused in a step of rolling the stainless steel foil 2 is removed. The preparatory heat treatment is performed in an atmosphere consisting of one or a mixture of two or more selected from an $N_2$ gas, an $H_2$ gas, an Ar gas, an AX gas, and an HN gas. Since thermal pretreatment is performed in such an inert or reducing gas atmosphere, the oxidation of the stainless steel foil 2 is prevented. Incidentally, the AX gas refers to a mixed gas of 75% by volume $H_2$ and 25% by volume $N_2$ and the HN gas refers to a mixed gas of 3% to 10% by volume $H_2$ and 97% to 90% by volume $N_2$ as the balance.

When the temperature of preparatory heat treatment is lower than 250° C., the residual stress in the stainless steel foil 2 cannot be sufficiently removed. However, when it is higher than 1,050° C., grains in the stainless steel foil 2 are coarsened and surfaces of the stainless steel foil 2 are roughened, thereby causing a reduction in conversion efficiency. In addition, when Nb or Mo is not contained, transformation occurs at higher than 900° C. and therefore sufficient corrosion resistance cannot be achieved. Furthermore, in order to maintain the hardness of the stainless steel foil 2 without softening the stainless steel foil 2 and in order to increase the stiffness of the stainless steel foil 2, it is preferably 700° C. or lower. Thus, the temperature of preparatory heat treatment ranges from 250° C. to 1,050° C. It is preferably 250° C. to 900° C. and more preferably 250° C. to 700° C. Performing the preparatory heat treatment within this temperature range allows the deformation of the stainless steel foil 2 to be prevented and also allows residual stress to be removed. In order to exhibit such effects remarkably, holding several seconds at an attained temperature is sufficient regarding the time taken for thermal pretreatment.

In an integration type shown in FIG. 2, after the preparatory heat treatment is performed, the insulating coating 3 is formed on the stainless steel foil 2. A method for forming the insulating coating 3 is not particularly limited. A material for the insulating coating 3 is not particularly limited and is preferably an alumina coating which has been conventionally and widely used. Next, the back-contact 5 is formed on the insulating coating 3 so as to include a Mo layer and a coating of $Cu(In_{1-x}Ga_x)Se_2$ is formed thereon as the absorber layer 4.

In a grid type shown in FIG. 1, after the preparatory heat treatment is performed, the back-contact 5 is formed on the stainless steel foil 2. Next, the $Cu(In_{1-x}Ga_x)Se_2$ coating is formed on the back-contact 5 as the absorber layer 4.

In either case, before the insulating coating 3 or the back-contact 5 is formed on the stainless steel foil 2 subjected to the preparatory heat treatment, a Cr layer or the like referred to as a barrier layer may be formed in advance. In this case, the configuration of the insulating coating, the back-contact, and the absorber layer other than the barrier layer is the same as above.

In the present invention, a method for forming each of the insulating coating 3, the back-contact 5, and the absorber layer 4 is not particularly limited. Examples of a heat treatment method for coating formation for the absorber layer 4 include (A) a solid-phase method, (B) a gas-phase method, and (C) an evaporation method. These methods are summarized below.

(A) Solid-phase Method

A method in which after Se/In/(CuGa) is formed in such a way that In/(CuGa) and then Se are deposited on a substrate by sputtering and by vapor deposition, respectively, heat treatment is performed at 450° C. to 500° C., whereby a coating of $Cu(In_{1-x}Ga_x)Se_2$ is formed.

(B) Gas-phase Method

A method in which after a CIGS film (copper indium gallium diselenide film) is formed by heating In/(CuGa) in an atmosphere containing an $H_2Se$ gas, heat treatment is performed at a temperature of about 500° C., whereby a coating of $Cu(In_{1-x}Ga_x)Se_2$ is formed.

(C) Evaporation Method

A method in which after In, Ga, and Se are applied to a substrate at a temperature of 350° C. to 500° C., the temperature of the substrate is increased to 500° C. to 550° C., Se and Cu only are applied, and In, Ga, and Cu are then applied at 500° C. to 550° C. or In, Ga, Se, and Cu are vapor-deposited on the substrate at about 500° C. together, whereby a coating of $Cu(In_{1-x}Ga_x)Se_2$ is formed.

When the temperature of heat treatment for coating formation is lower than 450° C., crystals of $Cu(In_{1-x}Ga_x)Se_2$ are not sufficiently grown. However, when it is higher than 700° C., the deformation of the stainless steel foil 2 is increased and therefore the insulating coating 3, the back-contact 5, and the absorber layer 4 tend to peel off. Thus, the temperature of heat treatment for coating formation preferably ranges from 450° C. to 700° C. Performing heat treatment for coating formation within this temperature range allows the deformation of the stainless steel foil 2 to be prevented and also allows the $Cu(In_{1-x}Ga_x)Se_2$ crystals to be grown.

The solar cell substrate made of stainless steel foil 1 (FIG. 2) that is obtained in such a way that the insulating coating 3 is formed on the stainless steel foil 2 and the back-contact 5 and the absorber layer 4 are formed on the insulating coating 3 is reduced in deformation caused by heat treatment for coating formation because residual stress is removed by performing the preparatory heat treatment before the formation of the insulating coating 3. Alternatively, the solar cell substrate made of stainless steel foil 1 (FIG. 1) that is obtained in such a way that the back-contact 5 is formed on the stainless steel foil 2 and the absorber layer 4 is formed on the back-contact 5 is reduced in deformation caused by heat treatment for coating formation because residual stress is removed by performing the preparatory heat treatment before the formation of the back-contact 5.

That is, supposing the width of the stainless steel foil 2 before being subjected to coating formation heat treatment is $W_0$ (mm), the width of the stainless steel foil 2 after being subjected to coating formation heat treatment is $W_1$ (mm), the length of the stainless steel foil 2 before being subjected to coating formation heat treatment is $L_0$ (mm), and the length of the stainless steel foil 2 after being subjected to coating formation heat treatment is $L_1$ (mm), the changes in width and length satisfy the following inequalities (1) and (2) and the peeling off of the absorber layer 4, the back-contact 5, and the insulating coating 3 can be suppressed:

$$100 \times |(W_1-W_0)|/W_0 \leq 0.037\% \quad (1)$$

$$100 \times |(L_1-L_0)|/L_0 \leq 0.037\% \quad (2).$$

In order to further enhance the effect of suppressing the exfoliation of the absorber layer 4, the back-contact 5, and the insulating coating 3, the deformation of the stainless steel foil 2 due to coating formation heat treatment needs to be further reduced and therefore the changes in width and length of the stainless steel foil 2 are preferably kept within ranges given by the following inequalities (3) and (4):

$$100 \times |(W_1-W_0)|/W_0 \leq 0.018\% \quad (3)$$

$$100 \times |(L_1-L_0)|/L_0 \leq 0.018\% \quad (4).$$

As described above, in the solar cell substrate made of stainless steel foil 1 according to the present invention, the deformation of the stainless steel foil 2 due to coating formation heat treatment is reduced and therefore the peel off of the absorber layer 4, the back-contact 5, and the insulating coating 3 can be suppressed. As a result, a solar cell manufactured from the solar cell substrate made of stainless steel foil 1 according to the present invention can convert sunlight into electricity efficiently.

EXAMPLES

A solar cell substrate made of stainless steel foil 1 shown in FIG. 1 was manufactured and the deformation of stainless steel foil 2 was investigated. Furthermore, a solar cell was manufactured by attaching electrodes to the substrate and the conversion efficiency thereof was investigated. The procedure is described below.

After the stainless steel foil 2 (a thickness of 50 μm), which contained components shown in Table 1, was subjected to the preparatory heat treatment (a temperature of 400° C. to 700° C.) and a Mo layer was formed as a back-contact 5, then a coating of $Cu(In_{1-x}Ga_x)Se_2$ was formed as an absorber layer 4 by performing coating formation heat treatment by a solid-phase method. The temperature of heat treatment in the solid-phase method was 550° C. The solar cell substrate made of stainless steel foil 1 was manufactured as described above. In this procedure, before coating formation heat treatment was performed, ruled lines were drawn on a central portion of the stainless steel foil 2 in a widthwise direction and in a lengthwise direction. After coating formation heat treatment was performed, the ruled lines were measured for length and $100 \times (W_1-W_0)/W_0$ and $100 \times (L_1-L_0)/L_0$ were calculated, whereby the deformation of the stainless steel foil 2 was evaluated. The results are shown in Table 2.

A CdS coating was formed on the solar cell substrate made of stainless steel foil 1, which was obtained as described above, as a buffer layer. Next, a ZnO coating was formed as a transparent conducting film. Finally, a Ni—Al electrode was formed by vacuum deposition, whereby the solar cell was manufactured. The conversion efficiency of the solar cell was measured. This is referred to as an inventive example.

Incidentally, the conversion efficiency of converting sunlight into electricity is calculated by dividing the output obtained from the measurement of the generated current and voltage by the intensity of incident light.

On the other hand, a solar cell was manufactured through the same steps as those of the inventive example except that thermal pretreatment was not performed. The conversion efficiency thereof was measured. This is referred to as a comparative example.

For each of the inventive example and the comparative example, the deformation of the stainless steel foil and the conversion efficiency of the solar cell are shown in Table 2. Herein, in the changes in width and length of the stainless steel foil 2, the symbol "+" represents expansion and the symbol "−" represents contraction.

TABLE 1

| Stainless steel foil | Components (mass percent) | | | | | | | | |
|---|---|---|---|---|---|---|---|---|---|
| | C | Si | Mn | P | S | Cr | Cu | Nb | Mo |
| a | 0.037 | 0.23 | 0.51 | 0.028 | 0.003 | 16.2 | — | — | — |
| b | 0.006 | 0.20 | 0.20 | 0.025 | 0.005 | 9.4 | 0.4 | — | — |
| c | 0.010 | 0.23 | 0.44 | 0.025 | 0.003 | 17.7 | — | 0.42 | — |
| d | 0.004 | 0.34 | 0.20 | 0.025 | 0.003 | 14.8 | — | 0.52 | 1.58 |
| e | 0.005 | 0.29 | 0.15 | 0.025 | 0.003 | 18.9 | — | 0.36 | 1.84 |
| f | 0.008 | 0.09 | 0.17 | 0.025 | 0.003 | 17.9 | — | — | 1.20 |

TABLE 2

| | Deformation of stainless steel foil | | | Solar cell |
|---|---|---|---|---|
| | Change in width (%) | Change in length (%) | Absorber layer | Conversion efficiency (%) |
| Inventive example | 0 to −0.001 | +0.001 to −0.017 | Not Peeling off | 12.7 to 13.0 |
| Comparative example | +0.005 to −0.038 | −0.019 to −0.046 | Peeling off | 6.6 to 7.8 |

As is clear from Table 2, the deformation of the stainless steel foil of the inventive example is small. As a result, the peeling off of the absorber layer is suppressed and therefore the conversion efficiency of the solar cell is high.

According to the present invention, the peeling off of a coating for an absorber layer formed in a solar cell substrate (that is, a solar cell substrate made of stainless steel foil) including stainless steel foil which is inexpensive and which can be mass-manufactured can be prevented. This contributes to the reduction of production costs of solar cells, and enables the conversion efficiency of converting sunlight into electricity to be increased. Therefore, industrially particularly advantageous effects can be produced.

REFERENCE SIGNS LIST

1 Solar cell substrate made of stainless steel foil
2 Stainless steel foil
3 Insulating coating
4 Absorber layer
5 Back-contact

The invention claimed is:

1. A method for manufacturing a solar cell substrate made of stainless steel foil, comprising stainless steel foil which contains 7% to 40% by mass Cr and 0.36% to 1.5% by mass Nb, and which has a coefficient of linear expansion of $12.0 \times 10^{-6}/°$ C. or less at 0° C. to 100° C. and a thickness of 20 μm to 200 μm and which is subjected to preparatory heat treatment for stress relief in an atmosphere containing nitrogen within the range of 250° C. to 1,050° C., the preparatory heat treatment being performed before any layer is formed on a surface of the stainless steel foil; forming a back-contact made of a Mo layer on the surface of the stainless steel foil subjected to the preparatory heat treatment or an insulating coating on the surface of the stainless steel foil followed by forming the back-contact made of the Mo layer thereon; and forming an absorber layer made of $Cu(In_{1-x}Ga_x)Se_2$ on the back-contact by performing coating formation heat treatment such that a width and a length of the stainless steel foil before and after the coating formation heat treatment satisfy the following inequalities (1) and (2):

$$100 \times |(W_1 - W_0)|/W_0 \leq 0.037\% \quad (1);$$

$$100 \times |(L_1 - L_0)|/L_0 \leq 0.037\% \quad (2),$$

wherein $W_0$ is a width in mm of the stainless steel foil before being subjected to the forming of the back-contact, $W_1$ is a width in mm of the stainless steel foil after being subjected to the forming of the back-contact, $L_0$ is a length in mm of the stainless steel foil before being subjected to the forming of the back-contact, and $L_1$ is a length in mm of the stainless steel foil after being subjected to the forming of the back-contact.

2. The method for manufacturing a solar cell, substrate made of stainless steel foil according to claim 1, wherein the preparatory heat treatment is performed within the range of 250° C. to 900° C.

3. The method for manufacturing a sour cell substrate made of stainless steel foil according to claim 1, wherein the preparatory heat treatment is performed within the range of 250° C. to 700° C.

4. The method for manufacturing a solar cell substrate made of stainless steel foil according to claim 1, wherein the coating formation heat treatment is performed within the range of 450° C. to 700° C.

5. A solar cell substrate made of stainless steel foil produced in such a way that stainless steel foil which contains 7% to 40% by mass Cr and 0.36% to 1.5% by mass Nb, and which has a coefficient of linear expansion of $12.0 \times 10^{-6}/°$ C. or less at 0° C. to 100° C. and a thickness of 20 μm to 200 μm and which is subjected to the preparatory heat treatment for stress relief in an atmosphere containing nitrogen within the range of 250° C. to 1,050° C., the preparatory heat treatment being performed before any layer is formed on a surface of the stainless steel foil; a back-contact made of a Mo layer is formed on the surface of the stainless steel foil subjected to the preparatory heat treatment or an insulating coating is formed on the surface of the stainless steel foil followed by forming the back-contact made of the Mo layer thereon; and an absorber layer made of $Cu(In_{1-x}Ga_x)Se_2$ is formed on the back-contact by performing coating formation heat treatment, wherein width and length of the stainless steel foil before and after being subjected to the coating formation heat treatment satisfy the following inequalities (1) and (2):

$$100 \times |(W_1 - W_0)|/W_0 \leq 0.037\% \quad (1)$$

$$100 \times |(L_4 - L_0)|/L_0 \leq 0.037\% \quad (2)$$

where $W_0$ is the width (mm) of the stainless steel foil before being subjected to the coating formation heat treatment, $W_1$ is the width (mm) of the stainless steel foil after being subjected to the coating formation heat treatment, $L_0$ is the length (mm) of the stainless steel foil before being subjected to the coating formation heat treatment, and $L_1$ is the length (mm) of the stainless steel foil after being subjected to coating formation heat treatment.

6. The solar cell substrate made of stainless steel foil according to claim 5, wherein width and length of the stainless steel foil before and after being subjected to the coating formation heat treatment satisfy the following inequalities (3) and (4):

$$100 \times |(W_1 - W_0)|/W_0 \leq 0.018\% \quad (3)$$

$$100 \times |(L_1 - L_0)|/L_0 \leq 0.018\% \quad (4).$$

7. The solar cell substrate made of stainless steel foil according to claim 5, wherein the temperature of the preparatory heat treatment ranges from 250° C. to 700° C.

8. The solar cell substrate made of stainless steel foil according to claim 5, wherein the temperature of the coating formation heat treatment ranges from 450° C. to 700° C.

9. The method for manufacturing a solar cell substrate made of stainless steel foil according to claim 2, wherein the preparatory heat treatment is performed within the range of 250° C. to 700° C.

10. The method for manufacturing a so cell substrate made of stainless steel foil according to claim 2, wherein the coating formation heat treatment is performed within the range of 450° C. to 700° C.

11. The method for manufacturing a solar cell substrate made of stainless steel foil according to claim 3, wherein the coating formation heat treatment is performed within the range of 450° C. to 700° C.

12. The solar cell substrate made of stainless steel foil according to claim 6, wherein the temperature of the preparatory heat treatment ranges from 250° C. to 700° C.

13. The solar cell substrate made of stainless steel foil according to claim 6, wherein the temperature of the coating formation heat treatment ranges from 450° C. to 700° C.

14. The solar cell substrate made of stainless steel foil according to claim 7, wherein the temperature of the coating formation heat treatment ranges from 450° C. to 700° C.

15. The method for manufacturing a solar cell substrate made of stainless steel foil according to claim 9, wherein the coating formation heat treatment is performed within the range of 450° C. to 700° C.

16. The solar cell substrate made of stainless steel foil according to claim 12, wherein the temperature of the coating formation heat treatment ranges from 450° C. to 700° C.

* * * * *